United States Patent
Otremba et al.

(10) Patent No.: US 8,933,555 B2
(45) Date of Patent: Jan. 13, 2015

(54) SEMICONDUCTOR CHIP PACKAGE

(75) Inventors: Ralf Otremba, Kaufbeuren (DE); Josef Hoeglauer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 363 days.

(21) Appl. No.: 12/466,524

(22) Filed: May 15, 2009

(65) Prior Publication Data
US 2010/0289135 A1    Nov. 18, 2010

(51) Int. Cl.
H01L 29/84 (2006.01)
H01L 23/36 (2006.01)
H01L 23/31 (2006.01)
H01L 25/16 (2006.01)

(52) U.S. Cl.
CPC ............ H01L 23/36 (2013.01); H01L 23/3121 (2013.01); H01L 25/16 (2013.01); H01L 2225/06572 (2013.01); H01L 2924/12044 (2013.01); H01L 2924/13055 (2013.01); H01L 2924/13091 (2013.01); H01L 2924/14 (2013.01); H01L 2924/19042 (2013.01); H01L 2924/19043 (2013.01); H01L 2924/0002 (2013.01)
USPC ....................................... 257/698

(58) Field of Classification Search
USPC ......... 257/678, 684, 690, 693, 698, 706, 707, 257/712, 717, 718, 719, 686
See application file for complete search history.

(56) References Cited

U.S. PATENT DOCUMENTS

| | | | | |
|---|---|---|---|---|
| 4,095,253 A | * | 6/1978 | Yoshimura et al. | 257/796 |
| 5,371,404 A | | 12/1994 | Juskey et al. | |
| 5,398,166 A | * | 3/1995 | Yonezawa et al. | 361/784 |
| 5,579,205 A | * | 11/1996 | Tustaniwskyj et al. | 361/704 |
| 5,844,307 A | * | 12/1998 | Suzuki et al. | 257/690 |
| 6,271,469 B1 | | 8/2001 | Ma et al. | |
| 2004/0108580 A1 | * | 6/2004 | Tan et al. | 257/678 |
| 2004/0203244 A1 | | 10/2004 | Oshima | |
| 2005/0093114 A1 | * | 5/2005 | Son et al. | 257/668 |
| 2006/0103010 A1 | * | 5/2006 | Kim et al. | 257/706 |
| 2009/0016040 A1 | * | 1/2009 | Tanaka | 361/820 |
| 2009/0146285 A1 | * | 6/2009 | Pu et al. | 257/686 |
| 2010/0127386 A1 | * | 5/2010 | Meyer-Berg | 257/698 |

FOREIGN PATENT DOCUMENTS

| | | |
|---|---|---|
| DE | 10 2007 022 959 | 11/2008 |
| JP | 63-048852 | 3/1988 |
| JP | 2094549 | 4/1990 |

* cited by examiner

Primary Examiner — Colleen A Matthews
Assistant Examiner — William Harriston
(74) Attorney, Agent, or Firm — Dicke, Billig & Czaja, PLLC

(57) ABSTRACT

A semiconductor chip package is disclosed. One embodiment provides at least one semiconductor chip including contact elements on a first surface of the chip. An encapsulation layer covers the semiconductor chip. A metallization layer is applied above the first surface of the chip and the encapsulation layer. The metallization layer includes contact areas connected with the contact elements of the chip. External pins are connected with the contact areas.

7 Claims, 4 Drawing Sheets

US 8,933,555 B2

SEMICONDUCTOR CHIP PACKAGE

BACKGROUND

The present invention relates to a semiconductor chip package and a method of fabricating a semiconductor chip package.

Semiconductor chips include contact pads or contact elements on one or more of their surfaces. In a semiconductor chip package the semiconductor chip is embedded or housed within the chip package and the contact pads of the semiconductor chip are connected to external contact elements of the chip package.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
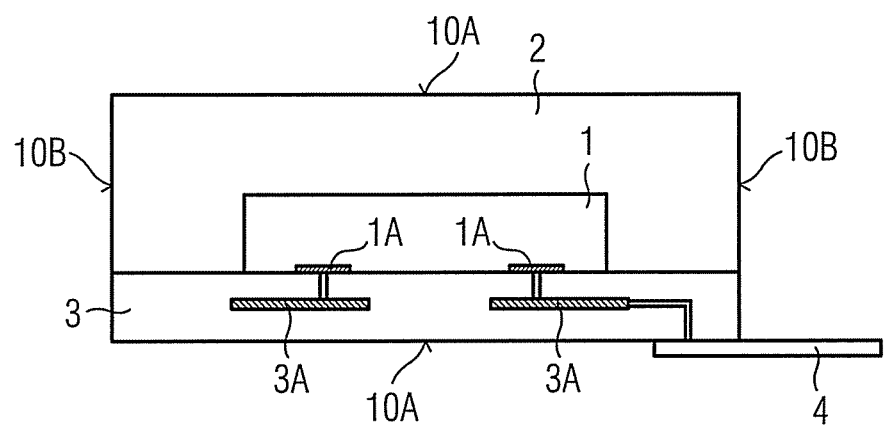
FIG. 1 illustrates a schematic cross-section representation of one embodiment of a semiconductor chip package.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The aspects and embodiments are described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are illustrated in schematic form in order to facilitate describing one or more aspects of the embodiments. It is to be understood that other embodiments may be utilized and structural or logical changes may be made without departing from the scope of the present invention.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

One or more embodiments of a semiconductor chip package and a method of fabricating a semiconductor chip package include at least one semiconductor chip. The semiconductor chips described herein may be of different types, may be manufactured by different technologies and may include for example integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor wafers and chips may include control circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in one embodiment on its two main surfaces, ton its front side and backside. By way of example, the source electrode and gate electrode of a power MOSFET may be situated on one main surface, while the drain electrode of the power MOSFET may be arranged on the other main surface. Furthermore, the devices described below may include integrated circuits to control the integrated circuits of other semiconductor chips, for example the integrated circuits of power semiconductor chips. The semiconductor chips described herein may be manufactured from any specific semiconductor material, for example Si, SiC, SiGe, GaAs, etc., and, furthermore, may contain inorganic and/or organic materials that are not semiconductors, such as for example insulators, plastics or metals.

The semiconductor chip package can also include at least one further semiconductor chip or other electrical device, all together embedded within one and the same package. In one embodiment, the semiconductor chip package can include a power supply module as, for example, one of a switching mode power supply (SMPS-) module, a converter module like a DC/DC converter module or a buck converter module, an H-bridge converter module, or a half-bridge converter module. Such module may include PWM (pulse width modulation) generators, comparators and A/D and/or D/A converters, all of them arranged in the form of one or more semiconductor chips and one or more electrical devices.

In several embodiments layers or layer stacks are applied to one another or materials are applied or deposited onto layers. It should be appreciated that any such terms as "applied" or "deposited" are meant to cover literally all kinds and techniques of applying layer onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on. One example for a layer to be applied is the redistribution layer (RDL). The redistribution layer can be in the form of a multi-layer, in one embodiment a multi-layer including a repeating layer sequence. The redistribution layer can also be in the form of a metallization layer including one or more planes in which metallic or electrically conductive contact areas are provided.

Furthermore, the semiconductor chips described below may include contact elements or contact pads on one or more of their outer surfaces wherein the contact elements serve for electrically contacting the semiconductor chips. The contact elements may have the form of lands, i.e., flat contact layers on an outer surface of the semiconductor chip. The metal layer(s) of which the contact elements are made may be manufactured with any desired material composition. Any desired metal or metal alloy, for example aluminum, titanium, gold, silver, copper, palladium, platinum, nickel, chromium or nickel vanadium, may be used as a layer material. The metal layer(s) need not be homogenous or manufactured from just one material, that is to say various compositions and concentrations of the materials contained in the metal layer(s) are possible. The contact elements may be situated on the active main surfaces of the semiconductor chips or on other surfaces of the semiconductor chips.

The semiconductor chips may become covered with an encapsulating material. The encapsulating material can be any electrically insulating material like, for example, any kind of molding material, any kind of epoxy material, or any kind of resin material. In the process of covering the semiconductor chips or dies with the encapsulating material, fan-out embedded dies can be fabricated. The fan-out embedded dies can be arranged in an array having the form e.g., of a wafer and will thus be called a "re-configured wafer" further below. However, it should be appreciated that the fan-out embedded die array is not limited to the form and shape of a wafer but can have any size and shape and any suitable array of semiconductor chips embedded therein.

In the claims and in the following description different embodiments of a method of fabricating a semiconductor chip package are described as a particular sequence of processes or measures in one embodiment in the flow diagrams. It is to be noted that the embodiments should not be limited to the particular sequence described. Particular ones or all of the processes or measures can also be conducted simultaneously or in any other useful and appropriate sequence.

FIG. 1 illustrates a cross-sectional representation of one embodiment of a semiconductor chip package. The semiconductor chip package 10 includes a semiconductor chip 1 including contact elements 1A on a first surface of the chip 1, an encapsulation layer 2 covering the semiconductor chip 1, a metallization layer 3 applied above the first surface of the chip 1 and the encapsulation layer 2, the metallization layer 3 including contact areas 3A connected with the contact elements 1A of the chip 1, and external pins 4 connected with the contact area 3A.

In the embodiment of FIG. 1, there is only illustrated one external pin 4 connected with one contact area 3A. It will be appreciated that further external pins 4 are connected with further contact areas 3A, respectively, wherein the external pins 4 can be arranged along a row or line extending outwardly from one of the outside faces of the chip package 10.

According to one embodiment the semiconductor chip package of FIG. 1 further includes at least one main face 10A and at least one side face 10B, the side face 10B having smaller area than the main face 10A, wherein the external pins 4 extend through a plane of the side face 10B. The external pins 4 can be provided in the plane of the main face 10A extending perpendicular to the plane of the side face 10B. In one embodiment, as illustrated in the embodiment of FIG. 1, a portion of the external pins 4 can be attached to the main face 10B and another portion of the external pins 4 extend outwardly adjoining the side face 10B. The external pins 4 can also extend through the side face 10B itself in which case they would extend with one portion into the interior of the package 10, in one embodiment into the metallization layer 3.

According to one embodiment the semiconductor chip package of FIG. 1 includes two opposing side faces 10B, wherein first external pins extend through a plane of the first side face and second external pins extend through a plane of the second side face.

One advantage of the aforementioned embodiments of a semiconductor chip package is that the semiconductor chip package 10 can be mounted to and electrically connected with a main board by using the external pins 4 as will be outlined in embodiments further below. The external pins 4 can then be connected to the main board by the well-known through-hole-technology, in one embodiment by wave soldering. This means that the heat load of the semiconductor chip package, in one embodiment the semiconductor chip, during mounting or soldering of the package to the main board can be kept remarkably low as, for example, compared with other mounting technologies like surface mounting technologies (SMT), as the heat generated in the mounting process will only be conducted by the relatively thin external pins 4 to the semiconductor chip package 10.

One further advantage of the aforementioned embodiment is that the two opposing main faces 10A of the semiconductor chip package 10 have larger areas than the two opposing side faces 10B of the semiconductor chip package 10 so that the main faces 10A could be utilized for providing one of a heat sink or one or more of further electrical devices thereon as will also be illustrated in embodiments further below. By attaching a heat sink to a main face, heat generated by, for example, a power semiconductor can be dissipated very efficiently.

The semiconductor chip package of FIG. 1 can be mounted and connected to a main board by through-hole-technology and, moreover, it can be easily detached and pulled out of the main board without affecting or damaging the main board in any way so that the main board could be re-used in a cost-efficient manner.

According to one embodiment the semiconductor chip package of FIG. 1 further includes at least one main face and a heat sink attached to the at least one main face. In one embodiment, the heat sink can be attached or mounted to the at least one main face in such a manner that it is detachable from the semiconductor chip package.

According to one embodiment the semiconductor chip package of FIG. 1 includes at least one main face and an electrical device located above the main face. The electrical device can be, for example, one or more of a discrete electrical device, an active electrical device, a passive electrical device, an electrical circuit device and an integrated circuit device.

According to one embodiment the semiconductor chip package of FIG. 1 includes a first main face and a second main face, a first electrical device situated above the first main face and a second electrical device situated above the second main face. Again, the first electrical device and the second electrical device can be, for example, one or more of a discrete electrical device, an active electrical device, a passive electrical device, an electrical circuit device and an integrated circuit device.

According to one embodiment the semiconductor chip package of FIG. 1 includes a first main face and a second main face, a first electrical device situated above the first main face and one of a second electrical device and a heat sink situated above the second main face. Again the first electrical device and the second electrical device can be, for example, one or more of a discrete electrical device, an electrical circuit device and an integrated circuit device.

According to one embodiment of the semiconductor chip package of FIG. 1, the semiconductor chip package 1 includes a power supply module, in one embodiment a switching mode power supply (SMPS-) module or a converter module like a DC/DC or AC/DC converter module. More particular the semiconductor chip package may include the at least one semiconductor chip and besides that one or more of a further semiconductor chip, a discrete electrical device, an active electrical device, a passive electrical device, an electrical circuit device, and an integrated circuit device, all together being enclosed in the semiconductor chip package and embedded within the encapsulation layer 2. The power supply module can also be arranged such that part of the module is arranged within the package, i.e., embedded or encapsulated within the encapsulation layer, and another part of the module is arranged as one or more electrical devices provided on or above one of the outer faces of the package, in one embodiment one of the main faces or the two opposing main faces.

Typical values for the thicknesses of the components may be as follows. The thickness of the semiconductor chip typically ranges from 150 μm to 450 μm, the thickness of the encapsulation layer typically ranges from 300 μm to 700 μm, and the thickness of the metallization layer typically ranges from 50 μm to 300 μm.

Figure 2:
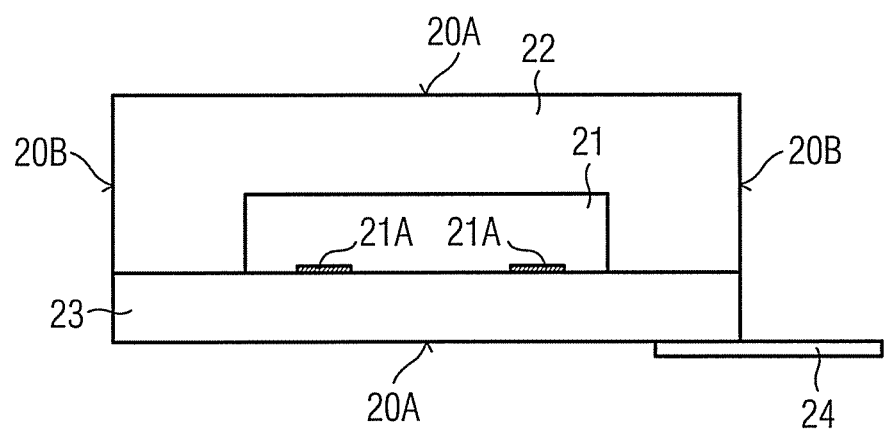
FIG. 2 illustrates a schematic cross-section representation of one embodiment of a semiconductor chip package.

Referring to FIG. 2, there is illustrated a cross-sectional representation of one embodiment of a semiconductor chip package. The semiconductor chip package 20 includes a semiconductor chip 21 including contact elements 21A on a first surface of the chip 21, an encapsulation layer 22 covering the semiconductor chip 21, a redistribution layer 23 applied above the first surface of the chip 21 and the encapsulation layer 22 and external pins 24 connected with the redistribution layer 23. The package 20 further includes main faces 20A and side faces 20B.

According to one embodiment of the semiconductor chip package of FIG. 2, the redistribution layer 23 may include a metallization layer, wherein the metallization layer may include contact areas connected with the contact elements 21A of the chip 21, and wherein the external pins 24 may be connected with the contact areas.

Further embodiments of the semiconductor chip package of FIG. 2 can be provided according to the embodiments as described above in connection with the semiconductor chip package of FIG. 1.

Figure 3:
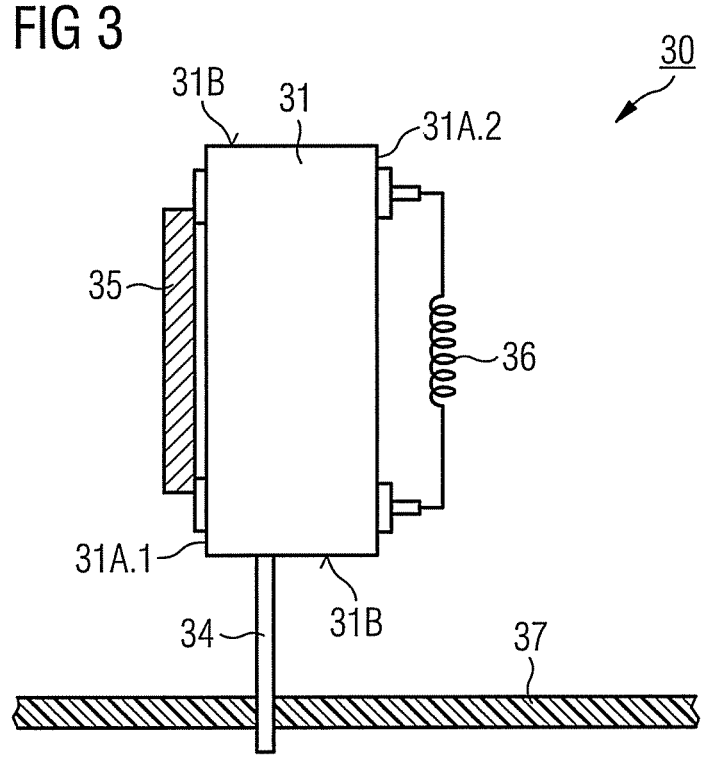
FIG. 3 illustrates a schematic cross-section representation of one embodiment of a semiconductor chip package, the chip package being connected to a main board.

Referring to FIG. 3, there is illustrated a cross-sectional representation of one embodiment of a semiconductor chip package. The semiconductor chip package 30 is illustrated in a state in which it is mounted and connected to a main board 37. The semiconductor chip package 30 includes external pins 34 mounted to the main board 37 by through-hole-technology. The semiconductor chip package 30 further includes a main body 31 which includes components which are not illustrated in further detail in FIG. 3 like a semiconductor chip, an encapsulation layer and a metallization layer or redistribution layer, the components being assembled in a form as illustrated in one of the embodiments of FIGS. 1 and 2. The embodiment of the semiconductor chip package 30 of FIG. 3 illustrates one embodiment of how the main faces of the main body 31 could be utilized. The main body 31 includes a first main face 31A.1 and a second main face 31A.2, first and second main faces 31A and 31B lying opposite each other, and two side faces 31B. On one or both of the first and second main faces 31A.1, 31A.2 electrical devices can be arranged and electrically connected to contact elements provided on the first and second main faces 31A.1, 31A.2. The first main face 31A.1 can be utilized by providing thereon a resistor 35, end portions thereof being electrically connected to electrical contact elements on the first surface 31A.1. The second main face 31A.2 can be utilized by providing thereon an inductor 36 and terminals thereof being electrically connected to electrical contact elements on the second main face 3 1A.2. The resistor 35 and the inductor 36 can also be replaced by other electrical devices like, for example, other discrete electrical devices, active or passive electrical devices, electrical circuit devices or integrated circuit devices. The semiconductor chip package 30 can also include a power supply module, in one embodiment a switching mode power supply (SMPS) module wherein the electrical devices being provided on the first and second main faces 3 1A. 1 and 3 1A.2 are part of the power supply module and the other part of the power supply module is housed and embedded within the main body 31 of the semiconductor chip package 30.

Figure 4:
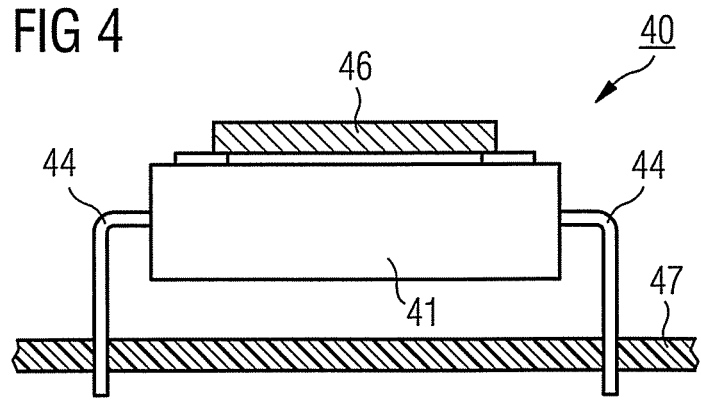
FIG. 4 illustrates a schematic cross-section representation of one embodiment of a semiconductor chip package, the chip package being connected to a main board.

Referring to FIG. 4, there is illustrated a cross-sectional representation of one embodiment of a semiconductor chip package. The semiconductor chip package 40 is illustrated in a state in which it is mounted and connected to a main board 47. The semiconductor chip package 40 includes external pins 44 mounted to the main board 47 by through-hole-technology. The semiconductor chip package 40 further includes a main body 41 which includes components which are not illustrated in further detail in FIG. 4 like a semiconductor chip, an encapsulation layer and a metallization layer or a redistribution layer, the afore the components being assembled in a form as illustrated in one of the embodiments of FIGS. 1 and 2. The external pins 44 of the semiconductor chip package 40 are arranged such that they extend through the opposing side faces of the main body 41, respectively, and are bent in a right angle so that they point into one and the same direction. In this way the semiconductor chip package 40 can be mounted to the main board 47 as illustrated in FIG. 4, namely such that a lower first main face of the main body 41 is situated opposite the upper surface of the main board 47. On an upper second main face of the main body 41, which is remote from the main board 47, an electrical device can be arranged which can be in principle any electrical device as was explained in the aforementioned embodiments. In one embodiment illustrated in FIG. 4 the electrical device is a resistor 46, the end portions of which are electrically connected with electrical contact elements on the upper main face of the main body 41. Instead of an electrical device also a heat sink can be arranged on the first main face of the main board 41 remote from the main board 47. It should be noted that also on the first lower main face of the main body 41 which faces the main board 47 one of an electrical device and a heat sink can be arranged in which case the vertical portions of the external pins 44 should be long enough so that the distance between the second face of the main body 41 and the main board 47 allows an arrangement of an electrical device or a heat sink on the first lower face of the main body 41.

Figure 5:
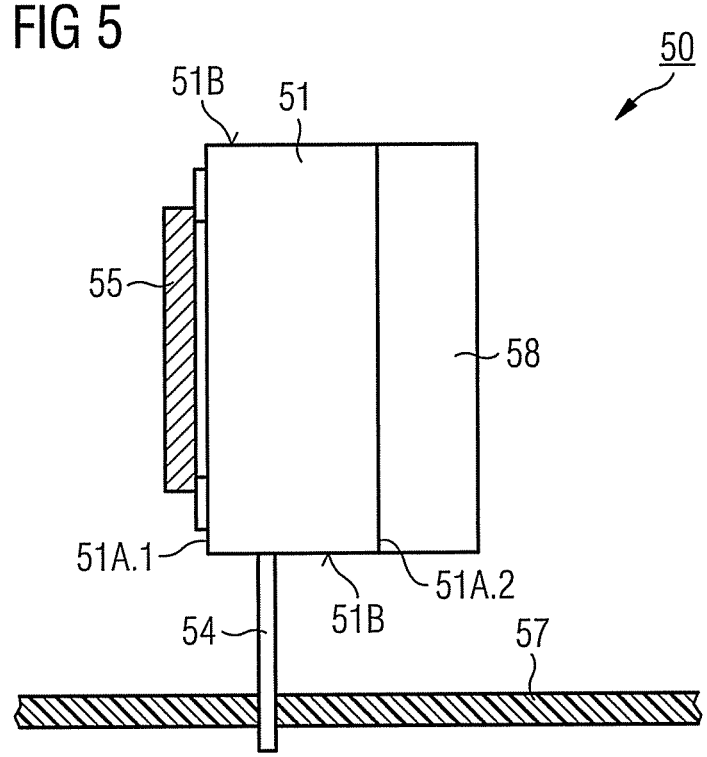
FIG. 5 illustrates a schematic cross-section representation of one embodiment of a semiconductor chip package, the chip package being connected to a main board.

Referring to FIG. 5, there is illustrated a cross-sectional representation of a semiconductor chip package according to one embodiment. The semiconductor chip package 50 as illustrated in FIG. 5 is illustrated in a state in which it is mounted and connected to a main board 57. The semiconductor chip package 50 includes external pins 54 mounted to a main board 57 by through-hole-technology. The semiconductor chip package 50 further includes a main body 51 which includes components which are not illustrated in further detail in FIG. 5 like a semiconductor chip, an encapsulation layer and a metallization layer or redistribution layer, the components being assembled in a form as illustrated in one of the embodiments of FIGS. 1 and 2 to form the main body 51. The main body 51 of the semiconductor chip package 50 includes a first main face 51A.1 and a second main face 51A.2. On the first main face 51A.1 of the main body 51 an electrical device can be arranged which can be in principle any electrical device as explained in one of the above embodiments. In the embodiment as illustrated in FIG. 5 the electrical device is formed of a resistor 55, the end portions of which are electrically contacted with electrical contact elements on the first main face 51A.1 of the main body 51. On the second face 51A.2 of the main body 51 a heat sink 58 can be arranged so that the second face 51A.2 of the main body 51 and one main surface of the heat sink 58 are attached to each other in a form-fit manner to optimize heat flow from the main body 51 to the heat sink 58.

The heat sink 58 can be made of any material of high heat conductivity, in one embodiment any metallic material like, for example, in the form of a block of elemental copper or a copper alloy. The heat sink 58 can have a second main face which is remote from the main body 51, wherein the second main face of the heat sink 58 can include ribs or any other structural elements which serve to enhance the surface area of the second surface of the heat sink 58 in order to improve the dissipation of heat of the outside, in one embodiment to any liquid or gaseous cooling medium like, for example, air flowing onto and along the second surface of the heat sink 58.

The heat sink 58 can be attached to the main body 51 by using at least one screw (not illustrated) fed through appropriate via holes (not illustrated) formed in and extending through the main body 51 and the heat sink 58. In addition, a metallic plate can be attached onto the second surface 51A.2 of the main body 51, the metallic plate being electrically connected to one of the electrical contact areas of the main body 51 like, for example, one of the contact areas as designated with the reference sign 3A in the embodiment of FIG. 1. In one embodiment, in case that the semiconductor chip package 50 contains a semiconductor chip having a power transistor, one of the terminals of the power transistor will be in electrical contact with one of the electrical contact areas 3A and the particular electrical contact area 3A will be contacted with the metallic plate attached on the second surface 51B of the main body 51 and the heat sink 58 is attached to the metallic plate resting on the second surface 51B of the main body 51. In this way, the heat generated by a power transistor embedded within the main body 51 of the semiconductor chip package 50 can be efficiently dissipated to the heat sink 58.

Figure 6:
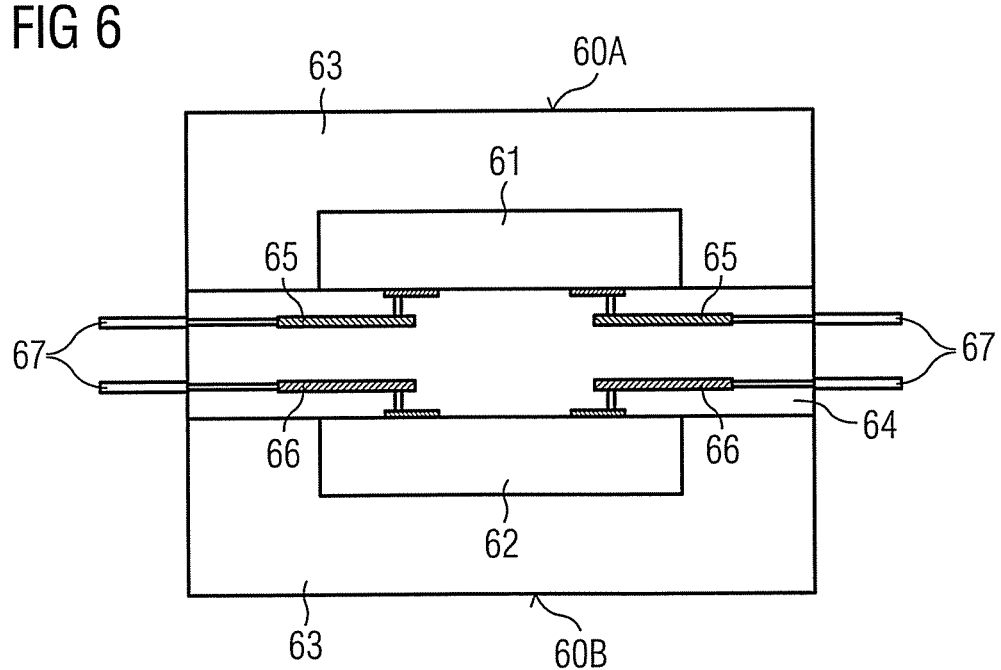
FIG. 6 illustrates a schematic cross-section representation of one embodiment of a semiconductor chip package.

Referring to FIG. 6, there is illustrated a cross-sectional representation of a semiconductor chip package according to one embodiment. The semiconductor chip package 60 includes a first semiconductor chip 61 and a second semiconductor chip 62, the two chips 61 and 62 being situated in an opposite relationship to each other. The semiconductor chips 61 and 62 are embedded in a common encapsulation layer 63 covering both chips 61 and 62. In between the semiconductor chips 61 and 62 a metallization layer 64 is arranged, the metallization layer 64 having the function of a redistribution layer. In a first plane within the metallization layer 64 first electrical contact areas 65 are arranged each of which is connected with one of the contact elements or contact pads of the first semiconductor chip 61. In a second plane within the metallization layer 64 second electrical contact areas 66 are arranged each of which is connected with one of the electrical contact elements or contact pads of the second semiconductor chip 62. The first electrical contact areas 65 and the second electrical contact areas 66 are each connected with external pins 67 extending through side faces of the semiconductor chip package 60. Again, the main faces 60A and 60B of the semiconductor chip package 60 could be utilized for placing one or more of an electrical device and a heat sink thereon.

Figure 7:
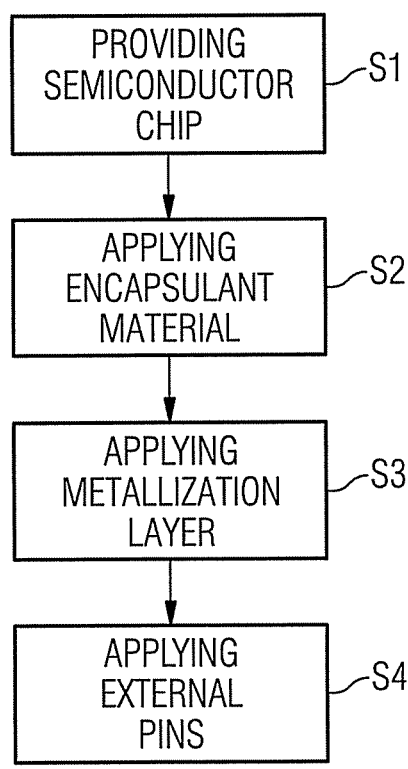
FIG. 7 illustrates a flow diagram of a method of fabricating a semiconductor chip package according to one embodiment.

Referring to FIG. 7 there is illustrated a flow diagram of a method of fabricating a semiconductor chip package according to one embodiment. The method includes providing at least one semiconductor chip including contact elements on a first surface of the chip (s1), applying an encapsulant material to the semiconductor chip (s2), applying a metallization layer above the first surface of the chip and the encapsulant material, the metallization layer including contact areas (s3), and applying external pins connected with the contact areas (s4).

According to one embodiment a plurality of semiconductor chip packages is fabricated by using an extended wafer level package process. In one embodiment, in such a process the above method further includes providing a plurality of semiconductor chips, fabricating an encapsulated structure by applying the encapsulant material to the plurality of semiconductor chips, applying the metallization layer to the encapsulated structure, separating the encapsulated structure into a plurality of semiconductor chip packages, and applying external pins to each one of the semiconductor chip packages.

According to one embodiment the method further includes attaching a heat sink to a main surface of the semiconductor chip package. In one embodiment the heat sink can be connected with one of the contact areas, wherein a metallic plate connected with the contact area can be applied to the main surface of the semiconductor chip package so that the heat sink will be attached onto the metallic plate to optimize heat dissipation from the electrical contact area to the metallic plate and the heat sink.

According to one embodiment the method further includes providing a first electrical device above a first main face of the semiconductor chip package and a second electrical device above a second main face of the semiconductor chip package. The first and second electrical devices can be one of a discrete electrical device, an active electrical device, a passive electrical device, an electrical circuit device or an integrated circuit device, respectively.

According to one embodiment the method further includes providing a first electrical device above a first main face of the semiconductor chip package and one of a second electrical device and a heat sink above a second main face of the semiconductor chip package.

Figure 8:
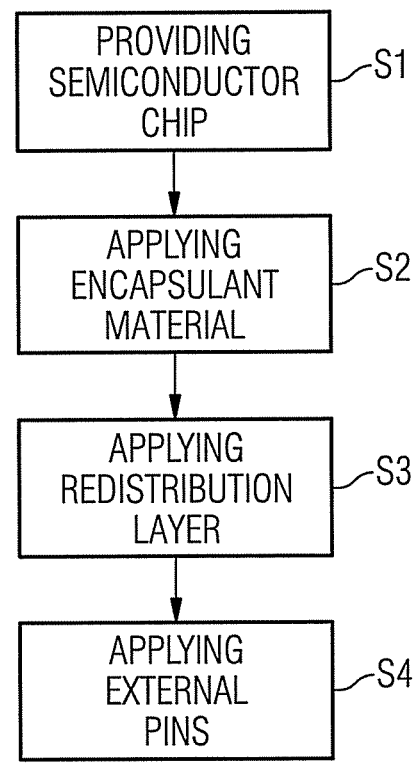
FIG. 8 illustrates a flow diagram of a method of fabricating a semiconductor chip package according to one embodiment.

Referring to FIG. 8, there is illustrated a flow diagram of a method of fabricating a semiconductor chip package according to one embodiment. The method includes providing at least one semiconductor chip including contact elements on a first surface of the chip (s1), applying an encapsulant material to the semiconductor chip (s2), applying a redistribution layer above the first surface of the chip and the encapsulant material (s3), and applying external pins connected with the redistribution layer (s4).

According to one embodiment the redistribution layer can have the form of a metallization layer, the metallization layer including contact areas, wherein the external pins are connected with the contact areas.

According to one embodiment a plurality of semiconductor chip packages can be fabricated in an extended wafer level process. In one embodiment within this process the above method further includes providing a plurality of semiconductor chips, fabricating an encapsulated structure by applying the encapsulant material to the plurality of semiconductor chips, applying the redistribution layer to the encapsulated structure, separating the encapsulated structure into a plurality of semiconductor chip packages, and applying external pins to each one of the semiconductor chip packages.

Further embodiments of this method can be provided in the same manner as the embodiment as described in connection with the method of FIG. 7.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor chip package, comprising:
   at least one semiconductor chip comprising contact elements on a first surface of the chip;
   an encapsulation layer covering a second surface of the semiconductor chip, the second surface opposite the first surface;
   a metallization layer applied above the first surface of the chip and the encapsulation layer, the metallization layer comprising contact areas connected with the contact elements of the chip;
   straight external pins which are non-contiguous with but electrically coupled to the contact areas, the external pins having an elongated, rod-like form;
   a first main face and a second main face lying opposite each other;
   a first electrical device situated on the first main face and electrically connected to contact elements provided on the first main face; and
   one of a second electrical device situated on the second main face and electrically connected to contact elements provided on the second main face and a heat sink situated on the second main face,
   wherein the semiconductor chip, the encapsulation layer, and the metallization layer are between the first main face and the second main face,
   wherein a surface of the encapsulation layer that is parallel to and facing the metallization layer is aligned with the first surface of the chip, and
   wherein the semiconductor chip package is configured to be mounted and connected to a main board by through-hole-technology such that the first surface of the chip is substantially perpendicular to the main board.

2. The semiconductor chip package of claim 1, further comprising:
   at least one side face, the side face having smaller area than the first main face, wherein
   the external pins extend through a plane of the side face.

3. The semiconductor chip package of claim 1, further comprising:
   a main board,
   wherein the semiconductor chip package is mounted and connected to the main board such that the first surface of the chip is substantially perpendicular to the main board.

4. A semiconductor chip package, comprising:
   at least one semiconductor chip comprising contact elements on a first surface of the chip;
   an encapsulation layer covering the semiconductor chip;
   a metallization layer applied above the first surface of the chip and the encapsulation layer, the metallization layer comprising contact areas connected with the contact elements of the chip;
   external pins which are separate from but electrically connected with the contact areas, the external pins having an elongated, rod-like form;
   a first main face and a second main face lying opposite each other;
   a first electrical device situated on the first main face and electrically connected to contact elements provided on the first main face; and
   a second electrical device situated on the second main face and electrically connected to contact elements provided on the second main face,
   wherein the semiconductor chip, the encapsulation layer, and the metallization layer are between the first main face and the second main face.

5. A semiconductor chip package, comprising:
   at least one semiconductor chip comprising contact elements on a first surface of the chip;
   an encapsulation layer covering the semiconductor chip;
   a metallization layer applied above the first surface of the chip and the encapsulation layer, the metallization layer comprising contact areas connected with the contact elements of the chip;
   external pins which are separate from but electrically connected with the contact areas, the external pins having an elongated, rod-like form;
   a first main face and a second main face lying opposite each other;
   a first electrical device situated on the first main face and electrically connected to contact elements provided on the first main face; and
   one of a second electrical device situated on the second main face and electrically connected to contact elements provided on the second main face and a heat sink situated on the second main face,
   wherein the semiconductor chip, the encapsulation layer, and the metallization layer are between the first main face and the second main face.

6. The semiconductor chip package of claim 1, wherein the semiconductor chip package comprises a power supply module.

7. A semiconductor chip package, comprising:
- at least one semiconductor chip comprising contact elements on a first surface of the chip;
- an encapsulation layer covering a second surface of the semiconductor chip, the second surface opposite the first surface;
- a metallization layer applied above the first surface of the chip and the encapsulation layer, the metallization layer comprising contact areas connected with the contact elements of the chip;
- straight external pins connected with the contact areas, the external pins having an elongated, rod-like form, wherein the external pins have a thickness different from a thickness of the contact areas;
- a first main face and a second main face lying opposite each other;
- a first electrical device situated on the first main face and electrically connected to contact elements provided on the first main face; and
- a second electrical device situated on the second main face and electrically connected to contact elements provided on the second main face,
- wherein the semiconductor chip, the encapsulation layer, and the metallization layer are between the first main face and the second main face,
- wherein a surface of the encapsulation layer that is parallel to and facing the metallization layer is aligned with the first surface of the chip, and
- wherein the semiconductor chip package is configured to be mounted and connected by through-hole-technology to a main board such that the first surface of the chip is substantially perpendicular to the main board.

* * * * *